United States Patent [19]

Brüning et al.

[11] 4,416,680

[45] Nov. 22, 1983

[54] METHOD OF MAKING QUARTZ GLASS CRUCIBLES, AND APPARATUS CARRYING OUT THE METHOD

[75] Inventors: Rolf Brüning, Bruchköbel; Friedhelm Habegger, Hammersbach, both of Fed. Rep. of Germany

[73] Assignee: Heraeus Quarzschmelze GmbH, Hanau, Fed. Rep. of Germany

[21] Appl. No.: 247,394

[22] Filed: Mar. 25, 1981

[30] Foreign Application Priority Data

Apr. 15, 1980 [DE] Fed. Rep. of Germany ....... 3014311

[51] Int. Cl.$^3$ ............................................. C03P 19/04
[52] U.S. Cl. ..................................... 65/144; 65/18.1; 65/157; 65/302; 425/425; 425/DIG. 60
[58] Field of Search ................. 65/302, 144, 157, 169, 65/18.1, 18.4, 25.1, 136, 347, 71; 264/102, 311, 335, DIG. 78; 425/425, DIG. 60

[56] References Cited

U.S. PATENT DOCUMENTS

| | | | |
|---|---|---|---|
| 2,026,940 | 1/1936 | Hendryx | 264/DIG. 78 |
| 3,687,650 | 8/1972 | Case et al. | 65/144 X |
| 3,818,974 | 6/1974 | Eberle | 65/302 X |
| 3,902,885 | 9/1975 | Rau | 65/302 |
| 4,266,925 | 5/1981 | Book | 425/DIG. 60 |

FOREIGN PATENT DOCUMENTS

| | | |
|---|---|---|
| 822005 | 11/1951 | Fed. Rep. of Germany . |
| 330943 | 6/1930 | United Kingdom . |
| 2075967 | 11/1981 | United Kingdom ................ 65/71 |

*Primary Examiner*—Kenneth M. Schor
*Attorney, Agent, or Firm*—Frishauf, Holtz, Goodman & Woodward

[57] ABSTRACT

To make quartz glass crucibles suitable for drawing of single crystal silicon for electronic semiconductor applications, granular crystalline quartz or amorphous quartz glass is introduced into a rotating hollow mold which has gas-pervious wall regions at the side walls and bottom thereof, for example by having bores extending through a metal mold or being made of porous, sintered material. After introducing the raw material, a heat source, such as an electric arc, is introduced into the hollow mold, causing first sintering and then melting of an inner layer; upon introduction of the hollow mold, a vacuum is applied to the outside of the hollow mold, for example between the housing and the mold body, and, during continued rotation, to draw out any included gases and cause melting-together of vacuoles which, otherwise, might form due to included spaces and gases within the granular filling material. The vacuum is maintained during melting and rotation, heating being interrupted when a sufficiently thick inner wall of molten material has been formed, with an adjacent layer of sintered material leaving, however, granular material immediately adjacent the inner walls of the hollow mold to provide for heat insulation of the molten layer with respect to the hollow mold and protect the surface of the mold. The finished crucible can be ejected by introducing compressed air, rather than vacuum, to the outside of the hollow mold. Suitable vacuum is a pressure of less than 5,000 Pa, preferably less than 1,000 Pa.

11 Claims, 1 Drawing Figure

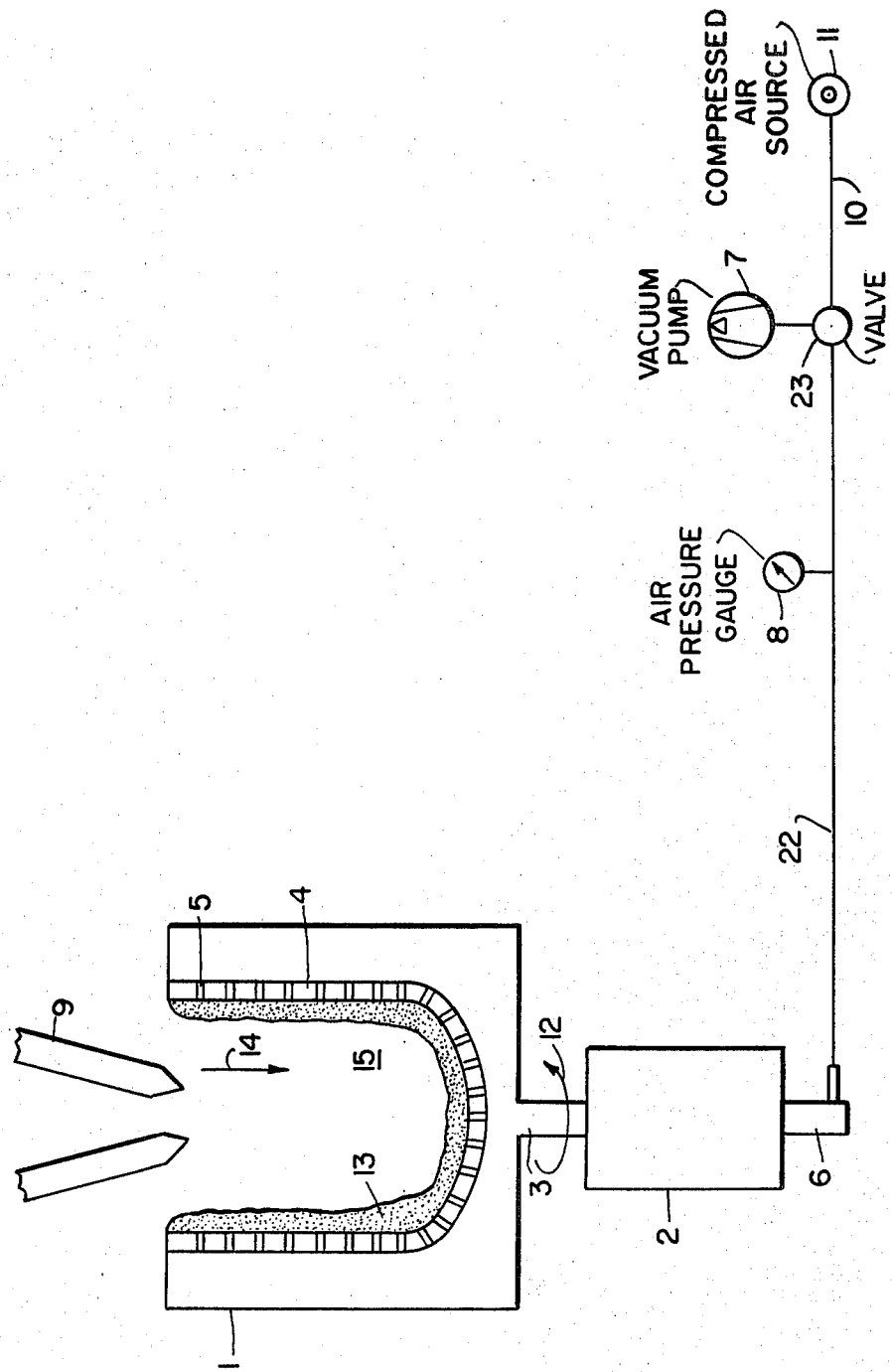

METHOD OF MAKING QUARTZ GLASS CRUCIBLES, AND APPARATUS CARRYING OUT THE METHOD

The present invention relates to a method and to an apparatus to manufacture quartz glass crucibles, and more particularly to crucibles which are suitable for use in pulling silicon single crystals for semiconductor applications.

BACKGROUND

It has previously been proposed to make crucibles of quartz glass by introducing a finely ground mass of crystalline quartz or amorphous quartz glass in a hollow mold which rotates about a vertical axis. The mold is made of a material which does not react with the quartz or quartz glass particles introduced therein when the quartz or quartz glass particles are heated. Filling can be continuous or in batches. As the mold rotates, a layer of quartz or quartz glass will form at the inner wall and on the bottom wall thereof. Heat is then applied from the interior of the mold to at least partially melt the introduced particles or powder of quartz or quartz glass. A thin partial layer will sinter. The remainder will be in a layer in granular form. After cooling, the quartz glass crucible can be removed from the hollow mold.

Manufacture of hollow bodies made of quartz by introducing comminuted starting material, such as quartz sand or granulated quartz crystals, in a rotatable hollow mold is described in German Patent DE-PS No. 543 957. The raw material is filled into a rotatable hollow mold, continuously or discontinuously, melted therein and sintered. Centrifugal force, upon rotation of the mold, presses the material against the inner wall of the mold. The hollow body is removed from the mold after cooling. The raw material is heated by a heat source positioned in the interior of the mold to heat the material to melting temperature or sintering temperature, respectively. In accordance with this process, hollow bodies are obtained which still contain air bubbles in their structure. To manufacture quartz glass bodies which are low in, or completely free from, air bubbles, it is necessary to sequentially introduce thin layers of raw material into the hollow crucible and to melt together the raw materials. Decrease in the air bubbles is obtained when air trapped in the granular raw material, during melting, at least partially escapes in the direction of the axis of rotation of the hollow mold.

It has been proposed to manufacture shaped hollow bodies of glass by introducing a glass tube into a hollow mold and, upon simultaneous rotation of the hollow mold and the tube, heating the tube and thus causing placement of the tube against the surface of the rotating hollow mold (see German Patent DE-PS No. 822 005). The bottom of the hollow mold may have suction openings applied thereto connected to a vacuum source. The bottom of the hollow mold which, of course, has only small or no centrifugal forces acting thereon, thus has applied a force against which the bottom of the glass is pressed, so that the glass will have the required shape as determined by the shape of the mold even in those regions where centrifugal forces are not active.

Crucibles, and other articles made of quartz glass or similar glasses, require structures which are essentially free from included air bubbles or other structural inperfections. Such articles are used in large quantities and, therefore, the manufacture thereof should be rapid and inexpensive, requiring as little applied energy for heating of the materials as possible.

THE INVENTION

It is an object to provide a method and an apparatus to make essentially bubble-free uniform crucibles of quartz glass which is inexpensive, economical in energy use, and does not degrade the apparatus used in the manufacture.

Briefly, in accordance with the invention, a hollow mold is made to have gas-pervious wall regions or portions at the side walls and at the bottom thereof; a pressure of less than 5,000 Pa is maintained at the outside of the hollow mold; preferably, the pressure is less than 1,000 Pa. The inside of the mold is open to ambient air.

Upon introduction of a heater into the hollow mold, the vacuum applied to the outside of the gas-pervious wall insures essentially bubble-free melting and/or sintering of the material while also leaving a layer of material which will not melt or sinter immediately adjacent the inner walls of the mold to protect the inner walls of the mold against the influence of high temperatures arising upon melting and/or sintering of the filled-in raw material.

The articles made by the method and in the apparatus of the present invention are essentially free from bubbles. It is believed that the uniformity of material and lack of bubbles is due to the phenomenon that the vacuum which is maintained will cause any bubbles which might occur to be free from gas; thus, bubbles which form will not include gas but, rather, will be vacuoles, that is, gas-free bubbles. Upon melting of the introduced raw materials, these vacuoles or gas-free bubbles will draw together and thus essentially completely disappear. Microscopically small vacuoles or bubbles cannot be entirely excluded at all times. Yet, the article obtained by the method and apparatus of the invention is such that the crucibles of quartz glass are essentially free of included bubbles, while being made in a single process step. In contrast to the multi-layer manufacture in accordance with the prior art (see, for example, German Pat. No. 543 957), the method uses substantially less energy, and is substantially less labor-intensive, so that the quartz glass crucibles made thereby are inexpensive, while providing essentially bubble-free articles of improved quality.

Quartz glass crucibles are used in substantial quantity to manufacture monocrystalline silicon for semiconductor application. For such use, it is important that the crucible is chemically of highest purity, and further that it is essentially free of bubbles while being inexpensive since, otherwise, the manufacture of monocrystalline silicon itself is substantially more costly.

It has been attempted to utilize the method above described which uses glass tubes, as exemplified by German Pat. No. 822 005, for the manufacture of quartz glass crucibles. It was not possible to utilize this method, however, with quartz glass to make crucibles particularly suitable for semiconductor technology. The method as described in very labor-intensive since, first, a quartz glass tube must be made. This tube then must be closed off at one end, and only thereafter it is possible to shape the tube in the mold, as described above. Due to the very high melting point of quartz glass, it is apparent that the method is energy-intensive when making quartz glass crucibles, requiring more than one melting and forming step of the raw material—first to make the tubing or caning, then to close the tubing or caning, and then shaping it as described in the mold. This method, while suitable for soft glass, is not applicable to quartz glass since the high viscosity of the quartz glass—in contrast to normal or soft glass—prevents acceptance of the shape of the mold by the hollow body which is closed at one end, that is, to provide the end product of a quartz glass crucible. To make a quartz glass crucible which is essentially free from imperfections and bubbles or the like requires a starting material which already is essentially free from bubbles and other imperfections, since the subsequent shaping method has no influence on the removal of any bubbles, imperfections, or discontinuities in the starting material, that is, the tubing or caning. Further, if this method were used for quartz glass, an undesirable reaction of the heated quartz glass with the material of the mold cannot be avoided since the quartz glass must be heated to deformation temperature, which is substantially higher than that of ordinary glass. Thus, the method as described cannot be applied to make quartz glass crucibles.

DRAWING

The single FIGURE, highly schematically, illustrates an apparatus suitable for carrying out the method, and shows an apparatus which is particularly adapted to make quartz glass crucibles for semiconductor applications.

A housing shell 1, which is rotatably positioned on a drive motor 2, is connected to the motor by means of a hollow shaft 3. The drive motor 2 may be any source of rotary energy, and need not be a motor drive as such, but can be, for example, a pulley arrangement for an external motor. The housing 1 has a hollow mold form 4 inserted therein in gas-tight manner. The hollow mold form 4, in the example, is made of metal which is formed with small continuous openings or bores 5 extending therethrough and throughout all wall surfaces thereof rather than making a mold of continuous metal with bores therethrough, a gas-pervious hollow mold of a sintered material can be used. A rotary coupling 6 is provided connected to the hollow shaft 3. Coupling 6 has a stationary output which is coupled to a vacuum pump 7. An indicator or control element 8 is coupled to the vacuum line connecting the vacuum coupling 6 with the pump 7. A heat source 9, for example an electrical arc, is provided which can be introduced into the hollow space within the mold. A compressed air source 11 can be connected to the fluid or air line 22 connecting the stub 6 and pump 7 by a connecting line 10. A valve 23 permits, selectively, connection of line 22 to either the vacuum pump 7 of compressed air line 10 from the compressed air source 11.

Method of manufacturing a quartz glass crucible: The mold form 4 is fitted into the housing 1 in gas-tight manner. The rotary drive is then started, and finely ground crystalline quartz or amorphous quartz glass, for example in fine granular form, is introduced into the rotating mold 4. A layer of granular material 13 will form at the inner wall and on the bottom of the hollow form. Rotation of the housing, as schematically indicated by arrow 12, causes adhesion of this layer at the side walls due to centrifugal force.

The vacuum pump 7 is then connected, and the heat source 9 is introduced into the interior of the mold in the direction of the arrow 14 to heat the granular material. Upon heating, a sinter layer will form first. This sinter layer will migrate through the granular material until just in advance of the inner surface of the mold 4 through the granules of the granular layer. The sinter layer will be followed by the actual melting layer. The space between the housing 1 and the hollow mold 4 will be subjected to a vacuum due to the action of the vacuum pump, the vacuum being maintained during the heating of the material in the mold which causes first sintering and then melting thereof. The vacuum is applied through the openings 5 on the granular material within the mold 4 and removes gases trapped or contained in the hollow spaces between the granules. The molten granular layer seals off the inner space 15 so that maintenance of vacuum is insured. The layer of granular material is melted over a substantial portion of its thickness. A thin sintered partial layer will remain; immediately adjacent the inner wall of the hollow form 4, a non-sintered, non-melted insulating layer will remain which permits utilization of materials for the hollow mold form 4 which might react with the quartz glass at the melting temperature thereof.

When the desired thickness of the melting layer of material has been reached, the heat source 9 is withdrawn from the interior space 15, and the melted and sintered granules are left within the mold form to solidify. Rotation of the housing continues to be maintained during solidification.

To remove the crucible thus made simply and easily, the vacuum pump is then disconnected by change-over of valve 23, and compressed air is introduced between the housing and the mold form 4. The crucible is pressed out of the mold form, similar to the force exerted against a piston upon penetration of compressed air through the bores 5. The crucible thus can be removed from the mold without damage to the crucible or damage or any deformation of the mold form 4.

A finished quartz glass crucible thus is obtained, without in any way impairing the integrity of the mold form 4, which can then be used for manufacture of a subsequent crucible by repeating the aforementioned method.

Various changes and modifications may be made within the scope of the inventive concept. For example, and in a preferred form, the hollow mold 4 is not cooled, that is, the housing 1 and the hollow mold are left at ambient operating temperature, the unsintered granular layer of material, while carrying out the process, providing for sufficient heat insulation between the melted and sintered layer of quartz and the hollow body as such.

In one example, the mold form 4 had an axial height of about 35 cm, and a clear diameter of 32 cm. It was made of Cr-Ni-Si-steel with bores of 0.5 mm diameter passing therethrough, spaced from each other by about 5 mm. Alternatively, a mold 4 of sintered Cr-Ni-Si-steel could be used. The rotary speed of the mold was 130 rpm. Approx. 9000 grams of pulverized crystalline quartz, having a grain size of 160 to 250 $\mu$m, which forms bridging elements larger than the diameters of the openings 5 through the mold 4, or of the pores of the sintered body, to prevent clogging of the openings, was introduced into the mold, resulting, upon rotation, in a layer 13 of a thickness of about 18 mm, varying approximately, as indicated in the FIGURE. After carrying out the method, a quartz glass crucible was obtained which was essentially free from included bubbles or vacuoles, and having a smooth inner wall of approx. 6 mm, varying slightly in thickness towards the axial opening, and being completely molten quartz glass with a thin outer layer of sintered quartz material of about 1 mm thickness. The remaining, unsintered, unmolten quartz glass, after removal of the crucible within the mold 4 had a thickness of about 8 to 10 mm, which is sufficient to protect the material of the mold 4 from reacting with the quartz of the quartz glass upon heating by the electric arc 9.

We claim:

1. Apparatus to manufacture crucibles made of quartz glass from granular particles of quartz, said crucibles being capable of being used in the manufacture of single-crystal silicon blanks for electronic semiconductor applications, said apparatus comprising
   a gas-tight housing (1);
   a hollow mold (4) having a bottom wall portion and a side wall portion and defining a hollow space therein, made of a material which does not react with heated quartz, inserted in said housing and gas-tight with respect thereto, leaving a space between the mold and the housing open to ambient air;
   means (2, 3) for rotatably supporting said housing (1) and said mold (4) therein to rotate said housing and said mold about a vertical axis;
   and heating means located with respect to said mold such that it is introducible into the hollow space of the hollow mold (4);
   wherein
   the hollow mold comprises:
      a metallic mold body formed with fine bores (5) through the walls thereof in both the bottom and side wall portions to form gas-pervious walls;
      and vacuum pump means (7) for furnishing a vacuum are provided, the vacuum being connectable to the space defined between the gas-tight housing and the hollow mold such that a vacuum can be applied through the gas-pervious walls of said hollow mold to draw the quartz particles against the walls and remove air as the particles first sinter and then fuse and melt under the influence of heat supplied by the heater means in the hollow space of the mold.

2. Apparatus according to claim 1, further including connection means (10, 23) to apply compressed air to the space between the housing (1) and the outside of the gas-pervious hollow mold to permit ejection of crucibles after melting and sintering in the hollow mold.

3. Apparatus according to claim 1, including a rotary vacuum connection joint (6) to couple vacuum from said vacuum pump means (7) to the space between the gas-tight housing (1) and the hollow mold (4).

4. Apparatus according to claim 1 wherein the vacuum pump means furnish a vacuum of less than 1,000 Pa.

5. Apparatus according to claim 1 wherein the vacuum pump means furnish a vacuum of less than 5,000 Pa.

6. Apparatus to manufacture crucibles made of quartz glass from granular particles of quartz, said crucibles being capable of being used in the manufacture of single-crystal silicon blanks for electronic semiconductor applications, said apparatus comprising
   a gas-tight housing (1);
   a hollow mold (4) having a bottom wall portion and a side wall portion and defining a hollow space therein, made of a material which does not react with heated quartz, inserted in said housing and gas-tight with respect thereto, leaving a space between the mold and the housing open to ambient air;
   means (2, 3) for rotatably supporting said housing (1) and said mold (4) therein to rotate said housing and said mold about a vertical axis;
   and heating means located with respect to said mold such that it is introducible into the hollow space of the hollow mold (4);
   wherein
   the hollow mold comprises:
      a sintered metallic porous body which is porous to the extent that it is gas-pervious throughout its side and bottom walls;
      and vacuum pump means (7) for furnishing a vacuum are provided, the vacuum being connectable to the space defined between the gas-tight housing and the hollow mold such that a vacuum can be applied through the gas-pervious walls of said hollow mold to draw the quartz particles against the walls and remove air as the particles first sinter and then fuse and melt under the influence of heat supplied by the heater means in the hollow space of the mold.

7. Apparatus according to claim 6, further including connection means (10, 23) to apply compressed air to the space between the housing (1) and the outside of the gas-pervious hollow mold to permit ejection of crucibles after melting and sintering in the hollow mold.

8. Apparatus according to claim 6, including a rotary vacuum connection joint (6) to couple vacuum from said vacuum pump means (7) to the space between the gas-tight housing (1) and the hollow mold (4).

9. Apparatus according to claim 6 wherein the sintered porous body comprises sintered chromium-nickel-silicon steel.

10. Apparatus according to claim 6 wherein the vacuum pump means furnish a vacuum of less than 1,000 Pa.

11. Apparatus according to claim 6 wherein the vacuum pump means furnish a vacuum of less than 5,000 Pa.

* * * * *